(12) United States Patent
Nordgren et al.

(10) Patent No.: US 6,224,972 B1
(45) Date of Patent: May 1, 2001

(54) METHOD OF MAKING A PVD-COATED HSS DRILL

(75) Inventors: Anders Nordgren, Enskededalen; Peter Littecke, Huddinge; Hans Johansson, Stockholm, all of (SE)

(73) Assignee: Sandvik AB, Sandviken (SE)

( * ) Notice: Subject to any disclaimer, the term of this patent is extended or adjusted under 35 U.S.C. 154(b) by 0 days.

(21) Appl. No.: 09/254,539

(22) PCT Filed: Oct. 9, 1997

(86) PCT No.: PCT/SE97/01691

§ 371 Date: Jun. 7, 1999

§ 102(e) Date: Jun. 7, 1999

(87) PCT Pub. No.: WO98/17839

PCT Pub. Date: Apr. 30, 1998

(30) Foreign Application Priority Data

Oct. 22, 1996 (SE) .................................................. 9603887

(51) Int. Cl.$^7$ .................................................. C23C 14/02
(52) U.S. Cl. .............................. 428/336; 51/307; 51/309; 204/192.1; 204/192.15; 205/674; 427/337; 427/343; 427/523; 427/528; 427/530; 427/532; 427/580; 428/465; 428/472; 428/698
(58) Field of Search ..................... 51/307, 309; 407/119; 205/674; 204/192.1, 192.15; 427/523, 530, 528, 532, 580, 337, 343; 428/336, 469, 472, 698

(56) References Cited

U.S. PATENT DOCUMENTS

| | | |
|---|---|---|
| 3,767,544 | 10/1973 | Novosel et al. . |
| 4,405,422 | 9/1983 | Blomsterberg . |
| 4,406,759 * | 9/1983 | Saitoh .............................. 204/129.55 |
| 4,411,751 | 10/1983 | Blomsterberg . |
| 5,213,667 | 5/1993 | Hozer . |
| 5,380,408 * | 1/1995 | Svensson .............................. 156/656 |
| 5,591,320 | 1/1997 | Rolander . |

OTHER PUBLICATIONS

WPI/Derwent's abstract, No. 79–53614, week 7929, Abstract of JP, 54072587 (Sumitomo Electric Ind Co), 790611, & JP, A 54072587.

* cited by examiner

*Primary Examiner*—Archene Turner
(74) *Attorney, Agent, or Firm*—Burns, Doane, Swecker & Mathis, L.L.P.

(57) ABSTRACT

The present invention discloses an HSS tool with a PVD coating and with at least one cutting edge. The cutting edge has a radius of 15–25 μm and the carbides in the HSS are in contact with the coating. The present invention also relates to a method of making an HSS tool provided with a PVD coating with improved wear resistance. The improvement is obtained by subjecting the tool prior to the deposition of the coating to an electropolishing treatment such that a cutting edge radius of 15–25 μm is obtained and that the carbides in the HSS are revealed.

10 Claims, 1 Drawing Sheet

METHOD OF MAKING A PVD-COATED HSS DRILL

BACKGROUND OF THE INVENTION

The present invention relates to a method of making a high speed steel drill provided with a PVD-coating. By subjecting the drill to an electropolishing operation prior to depositing the coating, an unexpected decrease in tool wear has been obtained.

A substantial number of drilling operations in industry are today performed using drills of high speed steel, (HSS). For operations demanding more wear resistance and for drilling with high cutting speed, drills of solid cemented carbide or drills equipped with cemented carbide inserts are used. The use of such drills is increasing at the expense of HSS drills. For conventional high speed drills, the wear resistance can be improved to a considerable degree by providing them with a coating of a wear resistant, about 5 $\mu$m thick, layer of usually TiN which, in addition, gives the drills a nice golden color. The coating has to be applied by some PVD-process operating at a low temperature, below the softening temperature of the hardened and tempered HSS.

HSS drills are made from cylindrical bars in which the flute and edge are formed by grinding. A ground HSS drill often has a relatively rough surface in the flute, grinding burrs along the cutting edge and possibly thermal damages (grinding burns) in the HSS surface, resulting in a hardened and embrittled surface layer. The cutting edge on the ground drill is further often very sharp which increases the propensity for crack formation, chippings and edge fractures, especially when drilling in hard work materials.

After grinding of flutes and drill point, the coating is generally applied directly without further treatment other than conventional cleaning in order to remove dust, oil and other impurities from the grinding.

Electrolytic smoothing or deburring is a commonly employed technique. Two well-known processes are called electrochemical deburring and electropolishing. U.S. Pat. No. 4,405,422 discloses methods for electrolytic deburring of copper or copper alloys and U.S. Pat. No. 4,411,751 of steel or aluminum alloys. Swedish patent application SE 9404326-2 discloses a method for edge rounding of cutting tool inserts of cemented carbide or titanium based carbonitride alloys. An electrolytic method is used with an electrolyte which provides an even removal of both binder phase and hard constituent phases containing perchloric ($HClO_4$) or sulphuric ($H_2SO_4$) acid, 2–15 vol %, in methanol or other organic liquid.

The object of the present invention is to further improve the performance of coated HSS-drills by an electropolishing treatment.

In one aspect of the invention there is provided a high speed steel tool with carbides in the steel matrix, a PVD coating on at least a portion of the tool and at least one cutting edge wherein the cutting edge has a radius of 15–25 $\mu$m and the carbides in the high speed steel are in contact with the coating.

In another aspect of the invention there is provided a method of making a PVD coated high speed steel tool with at least one cutting edge wherein the tool is subjected to an electropolishing treatment such that a cutting edge radius of 15–25 $\mu$m is obtained and a light etching such that the carbides in the high speed steel are revealed and the tool is then coated by PVD.

DETAILED DESCRIPTION OF THE PREFERRED EMBODIMENTS OF THE INVENTION

Figure 1:
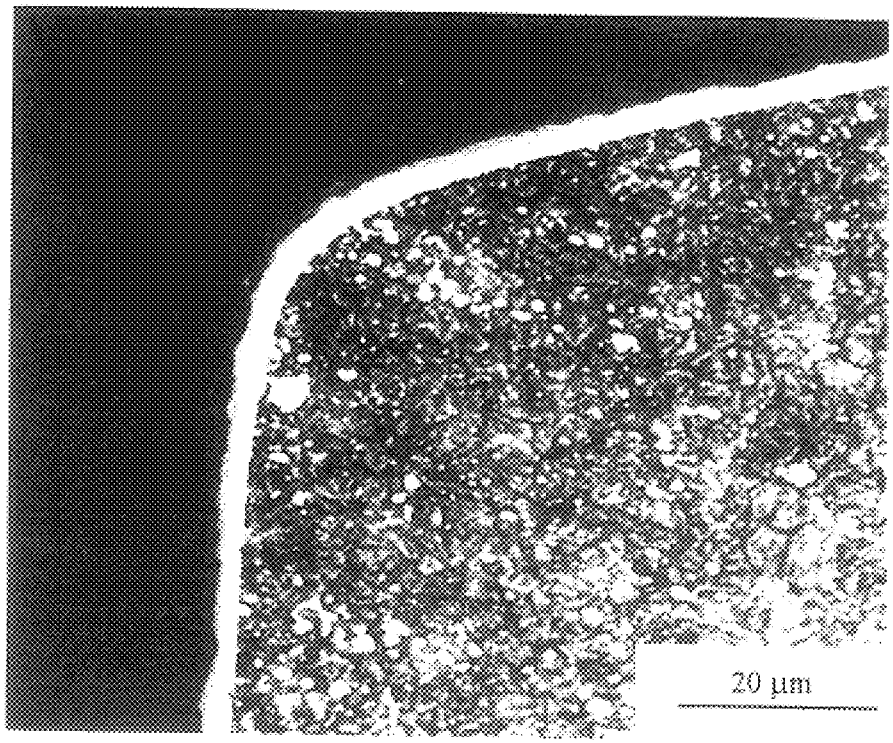
FIG. 1 shows in 1350X magnification a cross section of a cutting edge of a coated HSS drill treated according to the present invention.
Figure 2:
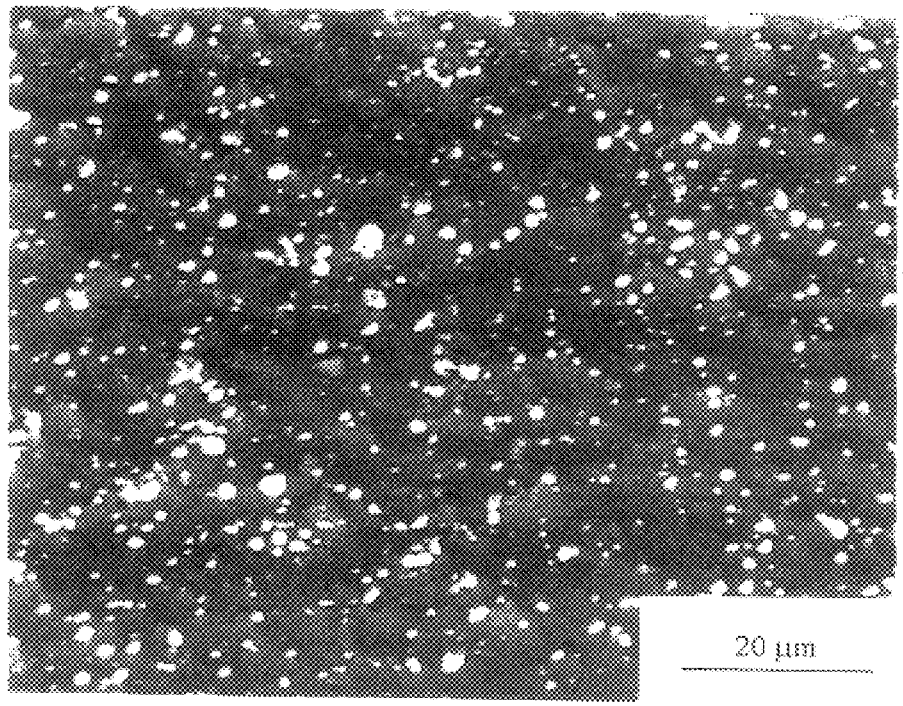
FIG. 2 shows in 1350X magnification the pattern of primary carbides revealed as a result of a treatment according to the invention.

It has now surprisingly been found that if a HSS drill is subjected to an electropolishing treatment prior to the application of a PVD coating, a significant reduction in wear and corresponding increase in tool life is obtained. In addition, a significant reduction of scatter in tool life is obtained.

The electrolytic polishing treatment shall be such that a well-defined 15–25 $\mu$m rounding of the cutting edge is obtained and that the pattern of primary carbides in the high speed steel is revealed by a light etching during the electropolishing treatment. The etching effect is part of the polishing treatment and takes place simultaneously with the rounding of the cutting edge.

A cutting edge according to the invention evidently results in a more favorable load distribution and prevents crack formation and edge chipping. The primary carbides in the high speed steel play an important role for the bonding of the coating to the steel. By revealing the carbide pattern, the coating adhesion is improved.

The polishing treatment according to the invention can be made with any known technique useful for polishing steel, preferably using electrolytes containing perchloric acid, glycerol and ethanol as well as with electrolytes containing ammonium salts, glycol and water. The preferred HSS are types M2, M7, M35 and M42 as well as powder metallurgically produced HSS type ASP23 and ASP30. The exact conditions to obtain the best result depend on the method used such as type of HSS, electrolyte, condition of the ground tool, etc., can therefore not be given. It is within the purview of the skilled artisan to determine by experiments the necessary condition for the electrolytic polishing treatment to obtain the desired edge radius and exposure of the primary carbides.

The PVD-coating can be single or multilayer. A single TiN-layer or a multi-layer coating consisting of several TiN- and Ti(C,N)-layers with an outer Ti(C,N)-layer is preferred. The coating shall have a thickness of 2–10 $\mu$m.

The PVD-coating can be deposited using ion-plating technique, the arc evaporation process or magnetron sputtering. The preferred PVD coating method is ion-plating.

A treatment according to the invention can also be applied to a drill which is used in uncoated condition. The improvement in such case is, however, not of the same order as that for a coated drill.

The invention has been described with reference to HSS drills but it is obvious that the method of the invention also can be applied to other HSS tools coated with a PVD-method such as end mills, etc.

The invention is additionally illustrated in connection with the following Examples which are to be considered as illustrative of the present invention. It should be understood, however, that the invention is not limited to the specific details of the Examples.

Example 1

Conventional HSS twist drills (diameter 5 mm and 8 mm) of grade M2 were prior to being coated electropolished in an electrolyte of 10 vol-% perchloric acid, 15 vol-% glycerol and 75 vol-% ethanol. The polishing was performed under the following conditions with the drill as anode: −20° C., stainless steel cathode, intense stirring, DC voltage 25 V and time 60 s. As a result the edge was rounded to a radius of about 20 μm and pattern of primary carbides were revealed. The 5 mm drills were coated with PVD TiN and the 8 mm drills with a multilayer PVD Ti(C,N)-coating consisting of several TiN and Ti(C,N)-layers (Balzer coatings Balinit A and B) of about 5 μm using the ion-plating technique. Reference drills from the same delivery but without the electrolytic treatment were coated at the same time.

Example 2

Two drills from Example 1 with diameter 5 mm were tested in a drilling operation under the following conditions:

Cutting speed: 35 m/min.
Feed: 0.12 mm/rev.
Hole depth: 15 mm (blind hole drilling).
Work material: Annealed tool steel (W.nr 1.2080).
Cooling: Liquid coolant (water based emulsion).

Table 1 shows the flank wear in the peripheral corner as a function of the number of drilled holes for a drill according to the invention and a ground drill.

TABLE 1

Flank wear [×10$^{-2}$ mm] for tested PVD TiN-coated HSS drills.

| Number of holes | Electropolished drill | Ground drill |
|---|---|---|
| 10 | 22 | 33 |
| 20 | 29 | 47 |
| 30 | 34 | 61 |
| 40 | 39 | 65 |
| 50 | 48 | 71 |

Example 3

Example 2 was repeated with two drills with diameter 8 mm. Table 2 shows the flank wear in the peripheral corner as a function of the number of drilled holes.

TABLE 2

Flank wear [×10$^{-2}$ mm] for tested PVD Ti(C, N)-coated HSS drills.

| Number of holes | Electropolished drill | Ground drill |
|---|---|---|
| 10 | 10 | 22 |
| 30 | 13 | 28 |
| 50 | 17 | 31 |
| 75 | 21 | 42 |
| 100 | 26 | 54 |

TABLE 2-continued

Flank wear [×10$^{-2}$ mm] for tested PVD Ti(C, N)-coated HSS drills.

| Number of holes | Electropolished drill | Ground drill |
|---|---|---|
| 125 | 34 | 64 |
| 150 | 36 | 68 |
| 175 | 40 | 74 |
| 200 | 40 | 125 |

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A high speed tool comprising carbides in a steel matrix, a PVD coating on at least a portion of the tool and at least one cutting edge wherein the cutting edge has a radius of 15–25 μm and the carbides in the high speed steel are in contacting with the coating.

2. The tool of claim 1 wherein the PVD coating has a thickness of 2–10 μm.

3. The tool of claim 1 wherein the PVD coating is a single TiN-layer.

4. The tool of claim 1 wherein the PVD coating comprises a multi-layer coating of several TiN-and Ti(C,N)-layers and an outer (Ti(C,N)-layer.

5. The tool of claim 1 wherein the high speed steel is of type M2, M7, M35, M42 or powder metallurgically produced high speed steel type ASP23 and ASP30.

6. The tool of claim 1 wherein the tool is a drill.

7. A method making a PVD coated high speed steel tool with at least one cutting edge wherein the tool is subjected to an electropolishing treatment such that a cutting edge radius of 15–25 μm is obtained and a light etching such that the carbides in the high speed steel are revealed and the tool is then coated by PVD.

8. The method of claim 7 wherein the electropolishing treatment is performed using an electrolyte containing perchloric acid, glycerol and ethanol.

9. The method of claim 7 wherein the electropolishing treatment is performed using an electrolyte containing ammonium salts, glycol and water.

10. The method of claim 7 wherein the PVD coating is applied by the ion-plating technique, the arc evaporation process or magnetron sputtering.

* * * * *